US005561790A

United States Patent [19]
Fusaro

[11] Patent Number: 5,561,790
[45] Date of Patent: Oct. 1, 1996

[54] SHORTEST PATH DETERMINATION PROCESSES FOR USE IN MODELING SYSTEMS AND COMMUNICATIONS NETWORKS

[75] Inventor: William E. Fusaro, Port Ewen, N.Y.

[73] Assignee: International Business Machines Corporation, Armonk, N.Y.

[21] Appl. No.: 472,162

[22] Filed: Jun. 7, 1995

Related U.S. Application Data

[63] Continuation of Ser. No. 874,238, Mar. 24, 1992, abandoned.

[51] Int. Cl.[6] .............................. G06F 17/30; G06F 17/50
[52] U.S. Cl. ...................... 395/500; 364/578; 364/221.2; 364/242.94; 364/275.6; 364/282.1; 364/284.4; 364/DIG. 1
[58] Field of Search ..................................... 395/500, 200, 395/600; 364/578, 488–491

[56] References Cited

U.S. PATENT DOCUMENTS

| | | | |
|---|---|---|---|
| 3,735,109 | 5/1973 | Berthelemy et al. | 235/185 |
| 4,748,660 | 5/1988 | Deveze | 379/272 |
| 4,864,559 | 9/1989 | Perlman | 370/60 |
| 4,873,517 | 10/1989 | Baratz et al. | 340/825.03 |
| 4,905,233 | 2/1990 | Cain et al. | 370/94.1 |
| 4,932,021 | 6/1990 | Moody | 370/54 |
| 4,987,536 | 1/1991 | Humblet . | |
| 5,111,413 | 5/1992 | Lazansky et al. | 364/578 |
| 5,191,541 | 3/1993 | Landman et al. | 364/489 |
| 5,257,200 | 10/1993 | Machala, III et al. | 364/488 |
| 5,297,057 | 3/1994 | Kramer et al. . | |
| 5,321,815 | 6/1994 | Bartolanzo, Jr. et al. | 395/200 |

*Primary Examiner*—Kevin J. Teska
*Assistant Examiner*—Ayni Mohamed
*Attorney, Agent, or Firm*—William A. Kinnaman, Jr., Esq.; Heslin & Rothenberg, P.C.

[57] ABSTRACT

Methods for operating a modeling system and/or a communications network, using a computer assisted process, are described, which transform a first set of signals, including (a) signals representing a given linear network defined in terms of a set of node identification signals, (b) a set of weighted/directed edge signals each of which identify the weight, direction and the pair of nodes in the network interconnected via a given edge, and (c) signals representing arbitrarily specified start and target nodes in the network, into a second set of signals indicating the shortest path in the network between the start and target nodes. The processes contemplated by the invention perform the aforementioned transformation by incrementally creating an array of node identification signals directly from the first set of signals. No starting matrix (or sparse matrix), as required by prior art processes, needs to be created or stored. Furthermore, the processes contemplated by the invention build the array as a function of array contents (as the array is being incrementally created). As a result of these features, it is not necessary to visit every node in the network to determine the shortest path between two nodes, and the shortest path determination can be made in a manner which conserves computing resources.

34 Claims, 9 Drawing Sheets

FIG. 4A

TABLE 1. MATRIX USED BY PRIOR ART PROCESSES

| / | A | B | C | D | E | F | G | H | I | ... |
|---|---|---|---|---|---|---|---|---|---|-----|
| A | 0 | - | - | - | - | - | - | - | - | ... |
| B | 3 | 0 | 9 | - | - | - | - | - | - | ... |
| C | - | 9 | 0 | - | 4 | - | - | 2 | - | ... |
| D | 5 | 6 | - | 0 | 2 | - | - | - | - | ... |
| E | - | - | 4 | 2 | 0 | - | 2 | - | - | ... |
| F | - | - | - | - | 9 | 0 | - | - | 7 | ... |
| G | - | - | - | - | - | 2 | 0 | 5 | - | ... |
| H | - | - | 2 | - | 8 | - | 5 | 0 | - | ... |
| I | - | - | - | - | - | 7 | - | - | 0 | ... |
| ... | ... | ... | ... | ... | ... | ... | ... | ... | ... | ... |

FIG. 4B

TABLE 2. OUTPUT OF PRIOR ART PROCESSES

| NODE | SHORT | PATH |
|------|-------|------|
| A | 0 | / |
| B | 3 | A |
| D | 5 | A |
| C | 11 | E |
| E | 7 | D |
| H | 13 | C |
| F | 16 | E |
| G | 18 | F |
| I | 13 | F |
| ... | ... | ... |

| TABLE 1. AFTER PROCESSING NODE A. | | | |
|---|---|---|---|
| NODE | PERM | SHORT | PATH |
| A | 1 | 0 | / |
| B | 0 | 3 | A |
| D | 0 | 5 | A |

FIG. 6A

| TABLE 2. AFTER PROCESSING NODE B. | | | |
|---|---|---|---|
| NODE | PERM | SHORT | PATH |
| A | 1 | 0 | / |
| B | 1 | 3 | A |
| D | 0 | 5 | A |
| C | 0 | 12 | B |

FIG. 6B

| TABLE 3. AFTER PROCESSING NODE D. | | | |
|---|---|---|---|
| NODE | PERM | SHORT | PATH |
| A | 1 | 0 | / |
| B | 1 | 3 | A |
| D | 1 | 5 | A |
| C | 0 | 12 | B |
| E | 0 | 7 | D |

FIG. 6C

| TABLE 4. AFTER PROCESSING NODE E. | | | |
|---|---|---|---|
| NODE | PERM | SHORT | PATH |
| A | 1 | 0 | / |
| B | 1 | 3 | A |
| D | 1 | 5 | A |
| C | 0 | 11 | E |
| E | 1 | 7 | D |
| H | 0 | 15 | E |
| F | 0 | 16 | E |

FIG. 6D

| TABLE 5. AFTER PROCESSING NODE C. | | | |
|---|---|---|---|
| NODE | PERM | SHORT | PATH |
| A | 1 | 0 | / |
| B | 1 | 3 | A |
| D | 1 | 5 | A |
| C | 1 | 11 | E |
| E | 1 | 7 | D |
| H | 0 | 13 | C |
| F | 0 | 16 | E |

FIG. 6E

TABLE 1. APPROXIMATE AMOUNT OF STORAGE REQUIRED (IN BYTES)

| PROCESS | NUMBER OF NODES | BEST CASE | AVERAGE CASE | WORST CASE |
|---|---|---|---|---|
| FULL MATRIX | 1000 | 1,020,000 | 1,020,000 | 1,020,000 |
| SPARSE MATRIX | 1000 | 45,000 | 45,000 | 45,000 |
| IMPROVED | 1000 | 120 | 2000 | 40,000 |
| FULL MATRIX | 5000 | 25,100,000 | 25,100,000 | 25,100,000 |
| SPARSE MATRIX | 5000 | 225,000 | 225,000 | 225,000 |
| IMPROVED | 5000 | 120 | 8000 | 200,000 |
| FULL MATRIX | 20,000 | 400,400,000 | 400,400,000 | 400,400,000 |
| SPARSE MATRIX | 20,000 | 900,000 | 900,000 | 900,000 |
| IMPROVED | 20,000 | 120 | 32,000 | 800,000 |

FIG. 7A

TABLE 2. APPROXIMATE TIME TO COMPLETE PROCESS

| PROCESS | NUMBER OF NODES | BEST CASE | AVERAGE CASE | WORST CASE |
|---|---|---|---|---|
| EXISTING | 1000 | 9 SECONDS | 24 SECONDS | 48 SECONDS |
| IMPROVED | 1000 | <1 SECOND | 2 SECONDS | 4 SECONDS |
| EXISTING | 5000 | 14 SECONDS | 2 MINUTES | 6 MINUTES |
| IMPROVED | 5000 | <1 SECOND | 8 SECONDS | 18 SECONDS |

FIG. 7B

```
/* ------------------------------------- */
/* | Begin the trace at the start node  | */
/* ------------------------------------- */
current_node = start_node;
Store_Node(current_node);

/* ------------------------------------------------- */
/* | The start node should be permanently labeled and | */
/* | have a shortest distance of 0.0                  | */
/* ------------------------------------------------- */
current_node-> perm_label = TRUE;
current_node-> shortest = 0.0 ;

/* ------------------------------------------------- */
/* | more_to_do will be set to false when the process | */
/* | is finished                                      | */
/* ------------------------------------------------- */
more_to_do = TRUE ;

/* ------------------------------------------------- */
/* | The first Part of the process:                  | */
/* |   Find all edges out from the current node.     | */
/* |   Store, the node at the "other" end of the edge. | */
/* ------------------------------------------------- */
while (more_to_do)
{
   while (Get_Next_Span(current_node, &span_data) == TRUE)
      Store_Node(span_data.other_node);

/* ------------------------------------------------- */
   /* | The second part of the process:                 | */
   /* |   From all non-perm labels, find the one with the | */
   /* |   shortest path and make it the "current" node. | */
   /* ------------------------------------------------- */
   current_node = Find_Smallest_Label();

/* ------------------------------------------------- */
   /* | If no more non_permanent labels were found, we are done | */
   /* ------------------------------------------------- */
   if (current_node == NULL )
      more_to_do = FALSE;
   /* ------------------------------------------------- */
   /* | If this was the end node, then we are done      | */
   /* ------------------------------------------------- */
   else if (current_node-> Id == end_node->Id)
      more_to_do = FALSE;

/* ------------------------------------------------- */
   /* | Otherwise permanently label the current_node    | */
   /* ------------------------------------------------- */
   else
      current_node-> perm_label=TRUE;
}
return;

Pseudo Code for Functions referenced

Get_Next_Span
      Get the next span at this node.
        If there are no more return FALSE.
      Fill in span_data with the data from the span Store_Node
      If the node is not already known, then
           store the node in the binary tree.
           set its label (shortest distance) to zero
           mark the label as non permanent;
           place the node in the non-permanent node linked list
    else
           if the shortest distance to this node so far is greater than
           the calculated shortest distance via the current node,
           then update the shortest distance.
      endif Find_Smallest_Label
      Go down the non-permanently label linked list, and return the node with the shortest distance.

If the linked list is empty, return NULL

FIG. 8B

SHORTEST PATH DETERMINATION PROCESSES FOR USE IN MODELING SYSTEMS AND COMMUNICATIONS NETWORKS

This application is a continuation of application Ser. No. 07/874,238 filed Mar. 24, 1992 now abandoned.

BACKGROUND OF THE INVENTION

1. Field of the Invention

The invention relates generally to geometric modeling systems that, with the aid of a digital computer, may be used to capture, manipulate, analyze and report data. Examples of such systems include geographical positioning systems (GPS), geographic information systems (GIS), computer aided design (CAD) systems and computer aided manufacturing (CAM) systems. The invention also relates generally to communications networks, such as the public telephone network, local area networks (LANs), and the like, which include a set of nodes interconnected by a set of communication links (defining the network), used to transmit data between a start node and a target (destination) node.

More particularly, the invention relates to processes which enable the determination of the shortest path between two nodes in a network, or network represented in the modeling system, to be efficiently ascertained when compared with the known processes for making such determinations. The known processes can be time consuming to practice (from a processor utilization point of view), and have the potential for requiring relatively large amounts of storage. This is particularly true as the size of the network and number of possible paths between nodes increases. The processes contemplated by the invention enable the shortest path determination problem to be solved quickly and efficiently, even in very large networks having many possible paths between nodes, saving both time and the unnecessary use of computing resources.

2. Definitions

1. A "modeling system" is a system that may be used to process (capture and manipulate) real world data and events, and process abstract data based on real world data and events. Examples of modeling systems include, but are not limited to, geographical positioning systems (GPS), geographic information systems (GIS), computer aided design (CAD) systems and computer aided manufacturing (CAM) systems.

2. A "modeling coordinate system" is a coordinate system which maps out a space that can completely contain all of the spatial or geometric data that a user can process using a given modeling system, in terms of a user's own units (e.g., feet, miles, degrees, etc.).

3. A "database coordinate system" is a coordinate system that accommodates the storage of data from a users modeling coordinate system without the loss of accuracy.

4. A "device coordinate system" is a coordinate system which maps out the available space on a given device (for example, a display device), into which data may be mapped. The data may, for example, be supplied via user interaction with a display device, may be mapped from (or to) a modeling coordinate system and/or database coordinate system, etc.

5. A "linear network" whether a physical network or a network represented in a modeling system, is defined as a set of nodes interconnected via a set of weighted/directed edges (or links).

6. A "permanent node" is defined as any given node in a linear network for which the shortest path from a designated start node to the given node has been fully determined.

7. An array is defined as being "incrementally" created if a first portion of the array is constructed with direct reference to a given database, followed by a second portion of the array being constructed after further direct reference to the database, etc.; as opposed to an array that is constructed from a matrix or sparse matrix (itself constructed with reference to the database), without further reference to the database.

8. An "array entry" is defined as a set of at least four array elements, including (a) an array element that uniquely identifies a given node in a linear network; (b) an array element that indicates if the given node is a permanent node; (c) an array element representing the calculated shortest weight to the given node, calculated as a function of the variable contents of array as the array is being constructed; and (4) an array element that indicates the identity of a previously visited node, in the path between the start node and the given node, which may be utilized to determine the shortest path from the target node back to the start node (at the completion of the array creation process), whenever the given node is actually in the shortest path between the start and target nodes.

DESCRIPTION OF THE PRIOR ART

In present day communications networks, and modeling systems in which such networks may be represented, it is often desirable to determine the shortest path between two nodes in the network, generally referred to as a "start" node and a "target" (or destination) node.

Such communications networks and modeling systems typically operate under the control of, or with the aid of, digital computers. An example of a communications network operating under the control of digital computers is the public telephone network. An example of a modeling system operating under the control (or with the aid) of a digital computer is the commercially available IBM 5080 computer system on which the commercially available Graphics Program Generator (GPG) software may be executed ("IBM" is a trademark owned by the International Business Machines Corporation).

The GPG software is described in IBM publication number SH20-5621-04, entitled "Graphics Program Generator Program Reference", fourth edition, copyright 1990, hereby incorporated by reference to describe a present day, commercially available system in which the invention may find application.

It is known that computers that support modeling systems (such as the IBM 5080), and communications networks, may be used to transform a first set of signals, including (a) signals representing a given linear network defined in terms of a set of node identification signals, (b) a set of weighted/directed edge signals each of which identify the weight, direction and the pair of nodes in the network interconnected via a given edge, and (c) signals representing arbitrarily specified start and target nodes in the network, into a second set of signals indicating the shortest path in the network between the start and target nodes.

The known methods utilized to perform such transformations (i.e., to determine the shortest path in said network between said start and target nodes, sometimes referred to hereinafter as "shortest path determination methods" or solutions to the "shortest path determination problem"), can be time consuming and can require vast amounts of storage. This is particularly true as the size of the network and number of possible paths between nodes increases, and can lead to the inefficient use of computing resources. In some cases, such as where many thousands or even millions nodes and potential paths between nodes need to be analyzed, computing resources exceeding those available on a users system may be required to make the aforementioned determination.

An example of a known method for performing the aforementioned transformation is used in connection with the above referenced GPG product and the modeling systems supported by the GPG product. In the GPG product, the process which is used to determine the shortest path between two nodes on a network is derived from an algorithm commonly referred to as "Dijkstra's algorithm". Dijkstra's algorithm is described by M. N. S Swamy and K. Thulasiraman in a publication entitled "Graphs, Networks, and Algorithms", copyright 1981, published by John Wiley and Sons, Inc., in Chapter 15, section 15.1.1, entitled "Shortest Path From A specified Node To All Other Vertices In A Graph".

Present day processes employing Dijkstra's algorithm are guaranteed to find the single shortest path on the network between the two given nodes. However, as indicated hereinabove, the processes may require large amounts of storage and be time consuming to execute.

The reason that the aforementioned problems, with regard to storage requirements and processing time, exist when using known shortest path determination methods, is that all such methods require that a given database (in which a given linear network is defined), first be extensively accessed (1) to determine the identity of all the nodes in the network, and (2) to obtain data concerning all of the weighted/directed edges between the nodes of the network. In the process of performing these steps, all the data retrieved from the database must then be stored, usually in the form of a matrix or sparse matrix, in computer memory, before executing the remaining method steps (e.g., steps implementing a version of Dijkstra's algorithm) which actually yield the shortest path determination.

In effect, the prior art methods may be thought of as "two step" processes requiring that the given database be queried for at least some information pertaining to each and every node and edge in a given network (the first step), before a shortest path determination (the second step) can be made.

The size of the aforementioned matrix is based on the number of nodes in the network. In some cases it is of size N×N, where N represents the total number of nodes in the network. An alternate approach, as indicated hereinabove, is to use a sparse matrix, slightly reducing storage requirements since some redundant or unused information is eliminated from the data that has to be stored; however, utilizing the sparse matrix technique does not appreciably improve the processing time required to practice the prior art shortest path determination processes.

Clearly, the process of creating and traversing this matrix (or sparse matrix) can be time consuming, particularly when the network being traced consists of several thousand, hundred thousand or even millions of nodes.

For example, if one wanted to find the shortest route between Albany and New York City, and the given network consisted of over a million highway sections in the United States, the amount of time and storage needed to perform such a trace using existing algorithms would be astronomical on account of the amount of data that would have to be retrieved from the database, be placed in a matrix (or sparse matrix), be stored in memory, and then be examined by the computer as part of an existing shortest path determination process.

Accordingly, it would be desirable to be able to provide processes that can be used to solve the aforementioned shortest path determination problem without having to first determine the identity of all the nodes in a given network, obtain data concerning all of the weighted/directed edges between the nodes of the network and then store this potentially vast amount of data.

Other examples of systems which include processes to solve the shortest path determination problem (in the context of communications networks versus the above described modeling system), include U.S. Pat. No. 4,905,233, issued Feb. 27, 1990, to Cain et al.; U.S. Pat. No. 4,873,517, issued Oct. 10, 1989, to Baratz et al.; and U.S. Pat. No. 4,987,536, issued Jan. 22, 1991, to Humblet.

Cain et al. teaches a mechanism for establishing at least one transmission route between a source node and a destination node, in a multinode communications network employing a form of shortest path or minimum delay mechanism (commonly termed a path or link metric), for determining which route is to be used to transmit data from source to destination.

The routing mechanism taught by Cain et al. examines the path metric of all paths that extend from a source node to a destination node. Using the metric of the shortest path, between the source node and the destination node as a reference, the metric of all shortest paths from all neighboring nodes to the destination node are examined to determine which path, if any, yields a metric total that exceeds the reference.

A path whose metric exceeds the reference is eliminated as a possible path for routing transmissions between the source and destinations nodes. As a result, any path that includes a node which is located farther away from the destination node than the source node is eliminated as a possible node in the desired routing transmission path.

Once all "non-feasible" nodes (and paths including such nodes) have been eliminated, the metric of the remaining "feasible" nodes (and paths) are employed to allocate the distribution of traffic over all the feasible paths in a manner which balances minimum average delay of data traffic through the network.

According to Cain et al., the shortest path calculations between a given start node and a target node are performed by using a conventional algorithm, such as the aforementioned Dijkstra's algorithm, and suffer from the problems set forth hereinbefore with respect to memory and processing time requirements.

In summary, Cain et al. discloses a path routing mechanism (shortest path finding technique) which uses a two stage mapping technique, including an implementation of Dijkstra's algorithm, to determine a set of candidate paths for routing traffic between a source and a destination node. Any path that includes a node which is located further away from the destination node than the source node is eliminated as a candidate path. However, the underlying shortest path determination techniques employed by Cain et al. are the aforementioned prior art processes, and suffer from the prior art related problems that the present invention seeks to alleviate.

Baratz et al., teaches a method for selecting a least weight route between two end nodes in a communications network. Because nodes and transmission paths in a real network possess different characteristics, it is a common practice (and a practice used in the context of the invention taught by Baratz) to assign weights to both nodes and the transmission paths between nodes, and to use the assigned weights in computing an optimal or least weight route through the network from one user to another. The weight generally reflects how close a given node or transmission path meets a predetermined standard of performance. For example, if weights were to be assigned on the basis of delay characteristics alone, a high-delay transmission path would have a greater assigned weight than a low-delay transmission path.

It should be noted that a weighting concept, similar to the one described in the Baratz et al. patent, is employed in connection with the present invention. In particular, weighted/directed edge information, which is defined for each edge in a given network, is used at least in part, in the manner to be described hereinafter, to solve the shortest path determination problem.

According to a further aspect of the teachings found in Baratz et al., in determining a "best" route through a network from a first user at one end node to a second user at another end node, the weight of the nodes and transmission paths in various potential routes are summed. The route having the lowest total weight is considered the "best" route between the users.

Still further, according to Baratz et al., the methods for determining an optimal route between two users of a communications network located respectively at an origin end node and a destination end node of the network, are practiced at a route computing network node in the network itself.

The route computing network node first utilizes information provided by the origin and destination nodes to compute least weight routes from those nodes to network adjacent to the origin and destination nodes. Next, the route computing network node uses information in the network topology database, stored at the route computing network node, to compute least weight routes from network nodes adjacent to the origin node to network nodes adjacent to the destination node. The results of these computations are concatenated to determine an optimum route from the origin node to the destination node.

It should be noted that when utilizing the teachings of Baratz et al., the network database stored at the node performing the aforementioned computation does not need to include information about the end nodes and the transmission paths which connect those end nodes to the network nodes.

However, Baratz et al. does not teach, claim or even suggest any new type of process for making shortest path determinations between the network nodes adjacent to the respective end nodes, and thus must presumably rely on traditional methods (for example, methods involving creation of the aforementioned matrix or sparse matrix from the database and then applying Dijkstra's algorithm, or a modification thereof), for making such determinations.

Finally, Humblet describes a communication network that includes computing apparatus for determining a shortest path from a starting node to a destination node in a network with a changing topology.

In Humblet, the computing apparatus is adapted so that each node forms a routing tree having nodes with identities, branches with weights, and a distinguished node called a route. The routing tree is the estimated shortest path to all the nodes and each node communicates its routing tree to each adjacent node. Thus, Humblet teaches keeping information at each node about its adjacent node and utilizing this information to ultimately compute a shortest path through the network.

Once again, like the other background art referred to hereinabove for illustrating the state of the art, Humblet is not directed to any new methods (processes) for directly solving the shortest path determination problem, and explicitly makes use of traditional methods (in particular a method which utilizes a variation of Dijkstra's algorithm), for making shortest path determinations.

Accordingly, it would be desirable to provide new shortest path determination processes that can be used in geometric modeling systems and other systems (such as communications networks), to guarantee the correct solution of the aforementioned shortest path determination problem, and at the same time (1) reduce the amount of computing resources (in terms of memory and processor time) needed to solve such problems (when compared with the known shortest path determination methods); (2) do not need to obtain information pertaining to each and every node and edge in a given network in order to function properly; (3) do not need to compile data concerning adjacent nodes, for storage at each node in the network, as part of a solution to the aforementioned shortest path determination problem, and (4) perform all shortest path computations outside the network itself; rather then at a route computing node located somewhere within the network.

SUMMARY OF THE INVENTION

It is an object of the invention to provide processes that can be used in geometric modeling systems and other systems (such as communications networks), to guarantee the correct solution of the aforementioned shortest path determination problem.

It is a further object of the invention to provide "single step" processes which can be used to directly solve the aforementioned shortest path determination problem, i.e. solve the problem without always first having to (a) determine the identity of all the nodes in a given network, (b) obtain data concerning all of the weighted/directed edges between the nodes of the network and then (c) store this data.

Furthermore, it is an object of the invention to provide processes for solving the shortest path determination problem, that reduce the amount of computing resources (in terms of memory and processor time) needed to solve such problems when compared with the known shortest path determination processes.

Further yet, it is an object of the invention to provide processes for solving the shortest path determination problem that do not need to obtain information pertaining to each and every node and edge in a given network, whether as part of a single or multiple step process, in order to function properly.

Still further, it is an object of the invention to provide processes for solving the shortest path determination problem that do not need, for their implementation or proper operation, to compile data (at each network node) concerning adjacent nodes, or require the use of a route computing node located within the network itself.

According to one aspect of the invention, a novel computer assisted single step process is provided that meets all of the aforestated objectives. The single step process may be advantageously used in operating a modeling system or communications network.

According to a further aspect of the invention, the novel process may be characterized as a method of operating a modeling system (or a communications network), with the aid of (or under the control of) a digital computer, to transform a first set of signals, including (a) signals representing a given linear network defined in terms of a set of node identification signals, (b) a set of weighted/directed edge signals each of which identify the weight, direction and the pair of nodes in the network interconnected via a given edge, and (c) signals representing arbitrarily specified start and target nodes in the network, into a second set of signals indicating the shortest path in the network between the start and target nodes, comprising the steps of: (a) providing the computer with a database that includes at least the first set of signals, wherein the database is accessible by the computer to retrieve data during the transformation process; and (b) transforming with the aid of the computer the first set of signals into the second set of signals by incrementally creating an array of node identification signals directly from the first set of signals.

According to another aspect of the invention, the method set forth hereinabove, as part of the step of transforming, further includes the step of determining the information to be retrieved from the database, to construct a given incremental portion of the array, as a function of the contents of the array itself as the array is being created.

A still further aspect of the invention is directed to a computer assisted process per se for transforming a first set of signals, including (a) signals representing a given linear network defined in terms of a set of node identification signals, (b) a set of weighted/directed edge signals each of which identify the weight, direction and the pair of nodes in the network interconnected via a given edge, and (c) signals representing arbitrarily specified start and target nodes in the network, into a second set of signals indicating the shortest path in the network between the start and target nodes, comprising the steps of:

(a) providing the computer with a database that includes at least the first set of signals, wherein the database is accessible by the computer to retrieve data during the transformation process; and (b) incrementally creating an array of node identification signals with the aid of the computer, directly from the first set of signals provided to the computer via the database.

Yet another aspect of the invention, with reference to the last recited method, as part of performing the step of incrementally creating, includes the step of determining the information to be retrieved from the database, to construct a given incremental portion of the array, as a function of the contents of the array itself as the array is being created.

A preferred embodiment of the invention features the utilization of binary trees and linked lists as part of a computer assisted one step process for solving the shortest path determination problem with maximum efficiency.

The type of processes contemplated by the invention have at least the following benefits when compared with prior art processes for solving the shortest path determination problem:

1. The number of data queries needed (accesses to the given database in which a given network is defined), is reduced to a minimum. There is no need to query all of the data for the entire network. Only the minimal number of queries needed to successfully completed the type of processes contemplated by the invention are required.

2. The amount of storage needed when tracing large networks (having several hundred, thousand or even greater numbers of nodes), is reduced by orders of magnitude since only a portion of the network is ever actually traced and needs to be stored.

3. The time to complete the type of process contemplated by the invention is also significantly reduced since not every node in the network needs to be examined.

These and other objects and features of the present invention and the manner of obtaining them will become apparent to those skilled in the art, and the invention itself will be best understood by reference to the following detailed description read in conjunction with the accompanying Drawing.

BRIEF DESCRIPTION OF THE DRAWINGS

FIG. 1 depicts portions of a commercially available Geographic Information System (GIS) in which the invention may be practiced.

FIGS. 4A–4B depict, in the form of two tables, an example of the type or matrix (in FIG. 4A) typically required by prior art shortest path determination processes (constructed with reference to the network depicted in FIG. 3), and an example of a portion of the array output by such processes (in FIG. 4B), from which the shortest path between two specified nodes may be determined.

FIGS. 6A–6E depict, in tabular form, the incremental creation of an array (and corresponding transformation of signals over time) by the type or process contemplated by the invention. In particular, the array entries represented in the tables shown in FIGS. 6A–6E are used herein to demonstrate how the shortest path between a specified start node, and a specifies target node, can be efficiently determined using the invention.

FIGS. 7A–7B depict, in tabular form, a comparison of the time and storage requirements to solve the shortest path determination problem utilizing two forms of prior art processes versus the type of process contemplated by the invention.

FIGS. 8A–8B depict, in the form of a C code listing, a particular implementation or the process contemplated by the invention, suitable for execution on a digital computer.

DETAILED DESCRIPTION

Figure 1:
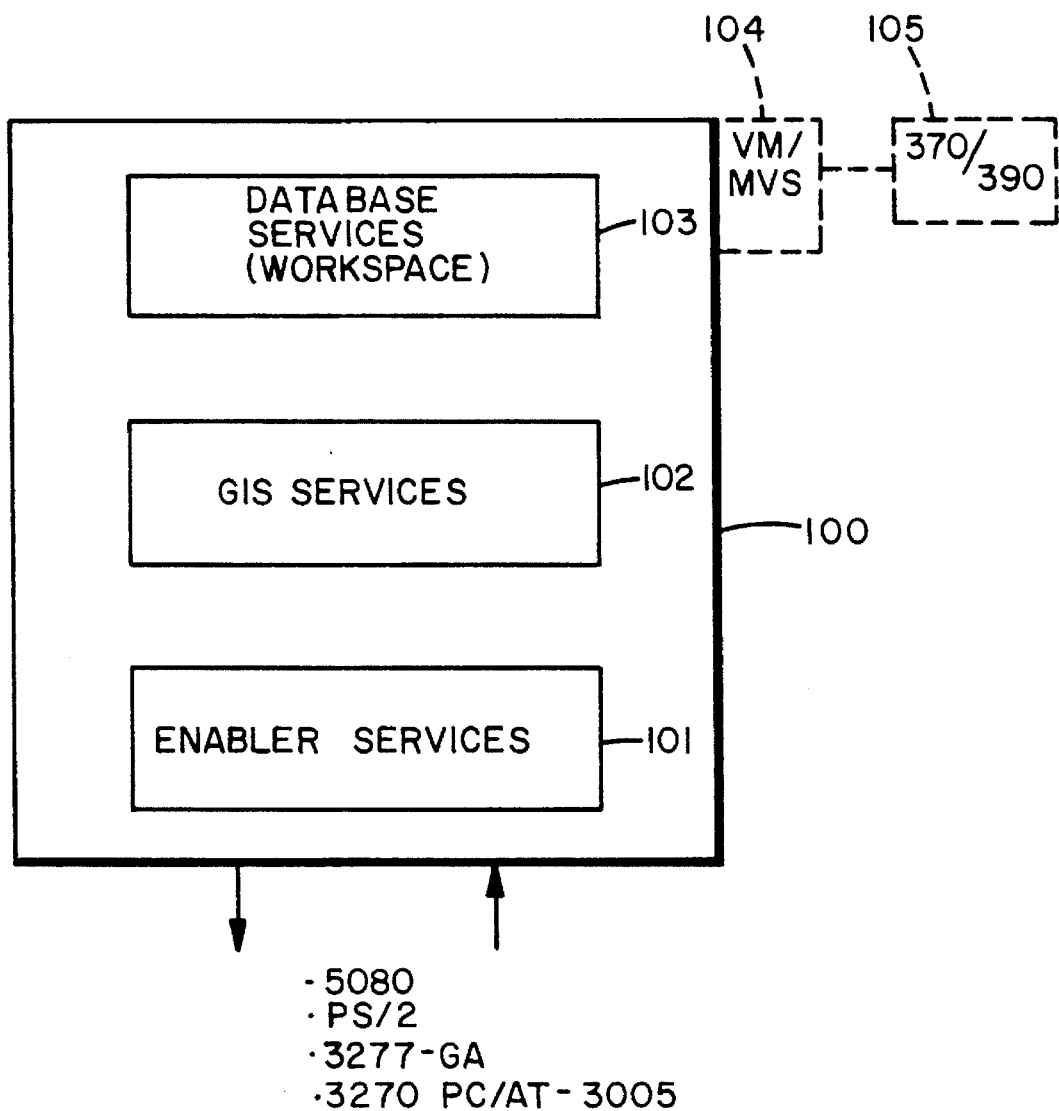
FIG. 1 depicts in block diagram form the elements of an exemplary prior art modeling system in which the invention may be advantageously used. In particular.

FIG. 1 depicts in block diagram form the elements of an exemplary prior art modeling system in which the invention may be advantageously used. Although such systems are well known by those skilled in the art, a brief overview of a commercially available geographic Information System (GIS) in which the invention may be practiced will, for the sake of completeness, be described with reference to FIG. 1.

The exemplary GIS system depicted in FIG. 1 can be realized by a combination of the aforementioned GPG software, as described in the previously incorporated reference, and, for example, the aforementioned IBM 5080 computer system, operating in a IBM System 370/390 environment. The GPG software, IBM 5080 and IBM 370/390 computers referred to hereinabove are all commercially available hardware and software products.

Other computer systems that can support the illustrative GPG GIS system in the exemplary system 370/390 environment include commercially available IBM PS/2 products, the IBM 3277-GA and the IBM 3270 PC/AT-3005. Each of the aforementioned products typically include a display, mouse, optional digitizer, and keyboard for allowing the user to interface with GIS 100 (as depicted in FIG. 1) via the Enabler Services 101 portion of GIS 100, also depicted in FIG. 1. Generally speaking the Enabler Services 101 portion of a GIS system, like GIS 100, services input/output requests between the user and the rest of the GIS system.

The next portion of GIS 100 depicted in FIG. 1 is the hardware and software making up GIS Services portion, 102 of the system. Several typical GIS Services, such as those provided by the aforementioned GPG software, are identified and will be explained in greater detail hereinafter with reference to FIG. 2. For now it is sufficient to say that these services could be, for example, CAD/CAM services, GPS services, accounting services, etc., and involve (1) the capture of data (for example, a mouse pointing to a river bed and tracing the river over a screen); (2) the manipulation of data (for example, moving a road on a map, moving the location of a fire hydrant, etc.); (3) the analysis of data (such as solving the aforementioned shortest path determination problem which is the subject of the present invention); and (4) reporting the results of GIS Services processing (for example, generating a report, plotting points and/or drawing points on a display screen, etc.).

FIG. 1 also depicts a Database Services portion 103 of GIS 100, which manages work space (also contained within Database Services portion 103 of GIS 100) allocated to the GIS Services portion 102 of GIS 100; and an operating system 104 (such as, for example, the commercially available VM or MVS operating system), for managing the interface between GIS 100 and a host computer (a main frame interactive product), such as the aforementioned IBM System 370/390 computer (shown at 105 in FIG. 1).

Figure 2:
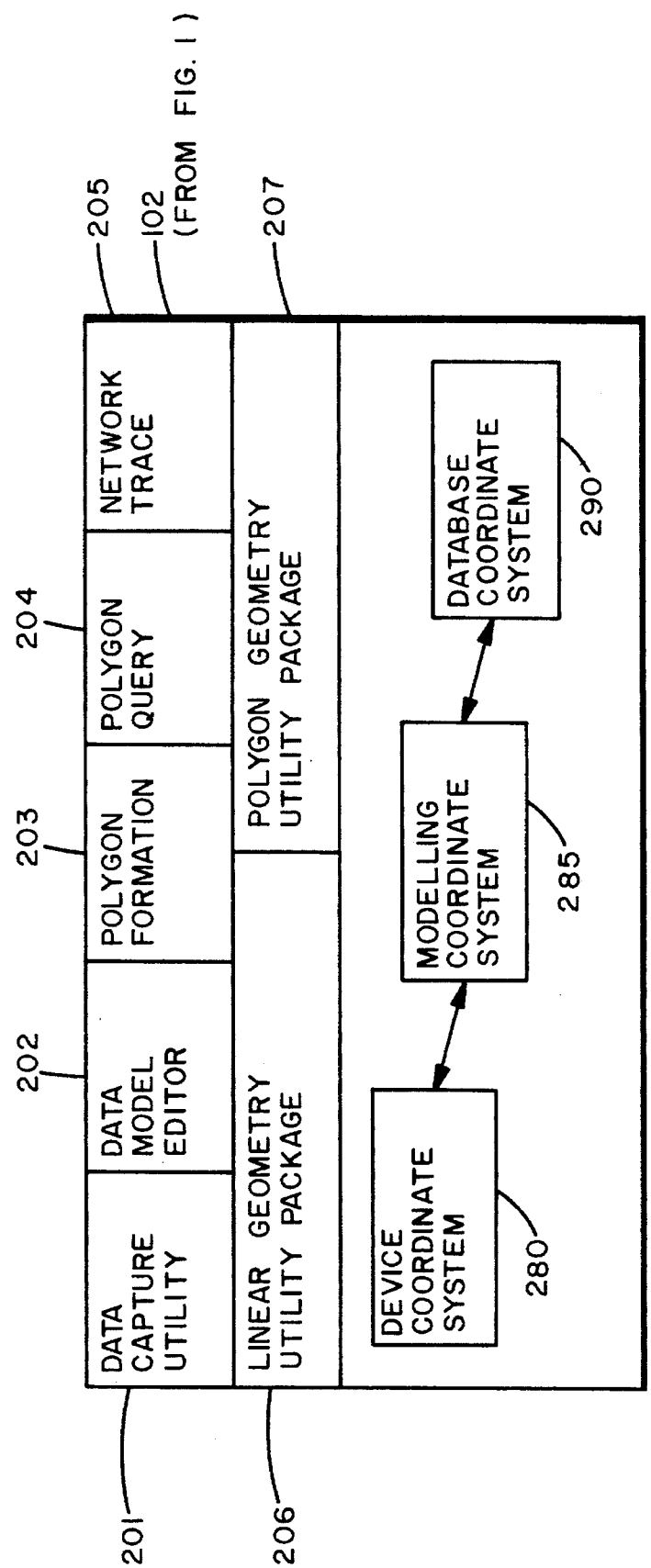
FIG. 2 depicts in greater detail the GIS Services portion of the exemplary GIS system depicted in FIG. 1.

As indicated hereinabove, FIG. 2 depicts in greater detail the GIS Service portion (portion 102 in FIG. 1) of the exemplary GIS system 100 depicted in FIG. 1. The exemplary GIS Services portion 102 is shown to include (usually in the form of software) a Data Capture utility (201); a Data Model Editor (202); Polygon Formation and Polygon Query sections (203 and 204, respectively ); a Network Trace section (205); Linear and Polygon Geometry utility packages (206 and 207, respectively); and software (not shown in FIG. 2) for converting between a set of defined coordinate systems, such as the device, modeling and database coordinate systems depicted in FIG. 2 at 280, 285 and 290 (with the various coordinate systems being defined as set forth hereinbefore).

The Data Capture utility 201 may be used to capture data input to GIS 100 via Enabler Services 101, by, for example, the aforementioned mouse pointing to a river bed and tracing the river over a screen coupled to GIS 100.

Data Model Editor 202 may be used to perform data analysis functions, such solving the problem of determining the closest point in a given ordered set of points (such as all ordered set of points defining a spline or polyline), to an arbitrarily specified point in a given modeling coordinate system.

Polygon Formation section 203 and Polygon Query section 204, may be used to literally form polygons given a set of data points, to analyze data in such a way as to answer questions such as "How close is the nearest fire hydrant to a piece of property represented by a given polygon?", etc.

Network Trace section 205 may be used, for example, to determine the shortest path between two nodes in a given network. Thus, Network Trace section 205 is the portion of GIS 100 where it would typically be desirable to invoke a process for solving the aforementioned shortest path determination problem, i.e. a process of the type which is the subject of the present invention.

The Linear Geometry utility package 206 depicted in FIG. 2 may, for example, be used to perform the transformation of signals necessary to compute the distance between two or more points when called upon to do so by, for example, Data Model Editor 202. Likewise, Polygon Geometry utility package 207, may, for example, be used to compare the area of parcels, determine the length of the perimeter of an object, etc.

Once again, the known processes for transforming signals with the aid of a digital computer to solve the shortest path determination problem, are inefficient (for the reasons set forth hereinbefore). Providing efficient processes for solving such problems in, for example, Network Trace section 205 in the context of a modeling system, such as GIS 100, is the subject matter of a principal aspect of the present invention.

Figure 3:
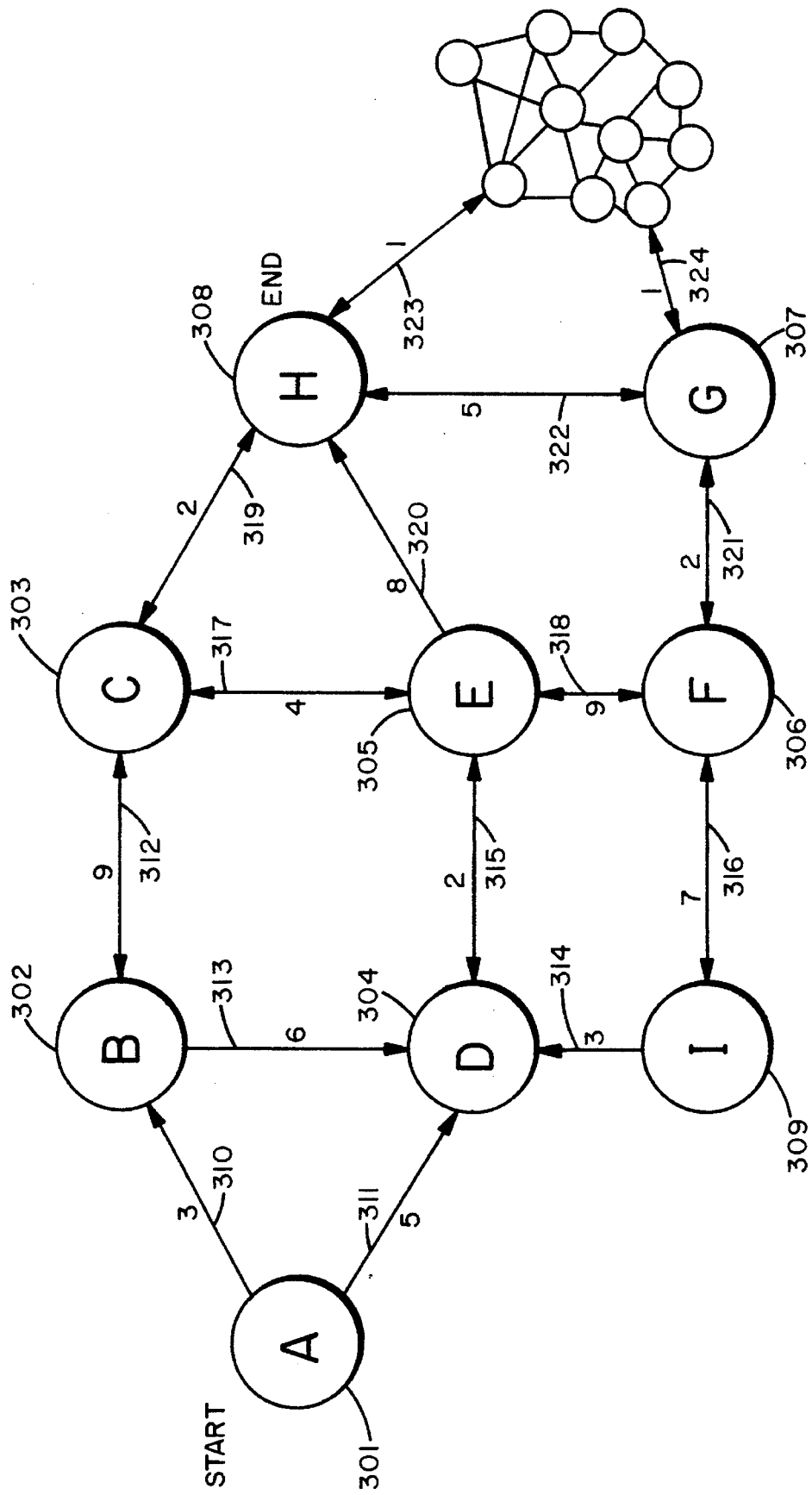
FIG. 3 depicts a linear network which could, for example, be a communications network, road system, etc., or a representation of a physical network in a modeling system, and is used to illustrate the principals of the invention in conjunction with the description of FIGS. 4A–4B, FIG. 5 and FIGS. 6A–6E.

Having described a commercially available modeling system (in particular a GIS system) in which the invention may be practiced (with specific reference to exemplary sections of the GIS Services portion 102 of GIS 100 where prior art processes for solving the aforementioned shortest path determination problem are in some systems employed); attention will now be directed to the illustrative network depicted in FIG. 3, and how to solve the shortest path determination problem with respect to two specified nodes in that network, utilizing (for the sake of comparison) both a known process for determining the shortest (least weight) path between the two nodes, and a process of the type contemplated by the invention.

The illustrative network depicted in FIG. 3 could, for example, be a physical communications network, road system, etc., or a representation of a physical network in a modeling system, and is shown to include 19 nodes, nine of which are labeled as nodes A–I, shown at 301–309 of FIG. 3, respectively. Fourteen weighted/directed edges between the nodes are also depicted in FIG. 3 (along with a number of other edges that are not labeled since they are not necessary to explain the principals of the invention). Each edge interconnects a pair of nodes. The fourteen edges having weights and directions depicted in FIG. 3 are labeled as edges 310–324.

Edge 310, interconnecting nodes A and B (located at 301 and 302 in FIG. 3, respectively) is shown to have a weight of 3 units (e.g., units of distance, time, resistance, etc.), and is shown as being unidirectional (by the direction of the arrowhead on edge 310) in the direction from node A to node B. This implies that node B can be reached from node A using edge 310 (expending 3 weight units); but that node A can not be reached from node B via edge 310.

The other edges and their corresponding weights and directions (as depicted in FIG. 3) are: edge 311, connecting nodes A and D, having an assigned weight of 5 units and being unidirectional from node A to B; edge 312, connecting nodes B and C, having an assigned weight of 9 units and being bidirectional; edge 313, connecting nodes B and D, having an assigned weight of 6 units and being unidirectional from node B to D; edge 314, connecting nodes D and I, having an assigned weight of 3 units and being unidirectional from node I to D; edge 315, connecting nodes D and E, having an assigned weight of 2 units and being bidirectional; edge 316, connecting nodes I and F, having an assigned weight of 7 units and being bidirectional; edge 317, connecting nodes C and E, having an assigned weight of 4 units and being bidirectional; edge 318, connecting nodes E and F, having an assigned weight of 9 units and being bidirectional; edge 319, connecting nodes C and H, having an assigned weight of 2 units and being bidirectional; edge 320, connecting nodes E and H, having an assigned weight of 8 units and being unidirectional from node E to H; edge 321, connecting nodes F and G, having an assigned weight of 2 units and being bidirectional; edge 322, connecting nodes H and G, having an assigned weight of: 5 units and being bidirectional; edge 323, connecting node H to the rest of the depicted network, having an assigned weight of 1 unit and being bidirectional with respect to the unspecified node in the network to which it is connected; and edge 324, connecting node G to the rest of the depicted network, having an assigned weight of 1 units and also being bidirectional with respect to the unspecified node in the network to which it is connected.

For the sake of illustration only, node A (301) is chosen as the "start" node, and node H (309) is chosen as the end (or target) node.

Assuming that the network, or modeling system containing a representation of the network, depicted in FIG. 3 is operated under the control (or with the assistance of) a digital computer, signals identifying the various nodes and weighted/directed edges in the depicted network can be stored in a database made available to the computer.

The novel processes contemplated by the invention, like their predecessors, involve transforming a first set of signals, including (a) signals representing a given linear network defined in terms of a set of node identification signals, (b) a set or weighted/directed edge signals each of which identify the weight, direction and the pair of nodes in said network interconnected via a given edge, and (c) signals representing arbitrarily specified start and target nodes in said network, into a second set of signals indicating the shortest path in said network between said start and target nodes.

However, the prior art processes first must create a matrix or sparse matrix (as indicated hereinabove) before being able to determine the shortest path from (in the case of the illustrative example being described with reference to FIG. 3) node A to node H.

Reference should be made to FIGS. 4A–4B which depict, in the form of two tables, an example of the type of matrix (in FIG. 4A) typically required by prior art shortest path determination processes (constructed with reference to the network depicted in FIG. 3), and an example of a portion of the array output by such processes (in FIG. 4B), from which the shortest path between two specified nodes may be determined.

FIG. 4A contains a row and a column for each node depicted in FIG. 3 (i.e., is a 19×19 matrix for the 19 nodes depicted in the network shown in FIG. 3), with the 9 row and column entries corresponding to nodes A–I being explicitly shown. The information contained in the matrix shown in FIG. 4A has to be extracted from the database (i.e., information about each and every node and edge in the network must be obtained), and be stored (requiring potentially vast amounts of storage as the number of matrix entries increases) before practicing, for example, the aforementioned Dijkstra's algorithm in accordance with prior art processes for determining the shortest path from node A to node H.

From the table shown in FIG. 4A, it can be seen that starting with a node at the head of a given column (for example, node A), node B (with reference to the "B" row of the matrix) can be reached expending 3 weight units. This corresponds to the information depicted in FIG. 3 with reference to edge 310. Similarly, by looking at column B and row A of the matrix, the matrix reflects the fact that, in accordance with the illustrative example being set forth with reference to FIG. 3, node A can not be reached from node B (edge 310 in FIG. 3 is unidirectional). The diagonal portion of the matrix indicates that the weight from a given node back to itself is 0.

As indicated hereinabove, some compression of the storage requirements are possible by utilizing well known sparse matrix storage techniques; however, these techniques do not appreciably conserve memory resources compared with the savings realizable using the processes contemplated by the invention.

FIG. 4B shows a portion of the typical output from a prior art process that takes the matrix shown in FIG. 4A (or corresponding sparse matrix) as input after having created the matrix (or sparse matrix) by accessing the database. The prior art process effectively transform the signals representing the matrix values into signals having the values indicated in the portion of the array depicted in FIG. 4B. The depicted array has 19 entries (one for each node), with only 9 entries being explicitly shown.

Examining the row associated with node H in the array depicted in FIG. 4B, the shortest path back to node A (and hence the shortest path between nodes A and H) can be ascertained with reference to the column of the array labeled "Path". For example, the array entry for node H indicates that the shortest path to node H from node A is 13 weight units (in the "Short" column), and by backtracking in the array, with reference to the "Path" entries, one can see that the shortest path traverses (in reverse order starting from node H), nodes C, E, D, and A (the path back toward the starting node from each entry is found in the respective entry's "Path" column).

Having described the typical way the shortest path determination problem is solved utilizing prior art processes, attention will now be directed to the processes contemplated by the invention.

Instead of the "two steps" described above (first creating the matrix or sparse matrix from the database, and then deriving the shortest path between two nodes therefrom), the single step processes contemplated by the invention determine the shortest path between the start and target nodes directly from the database without first having to (a) determine the identity of all the nodes in a given network, (b) obtain data concerning all of the weighted/directed edges between the nodes of the network and then (c) store this data, in order to perform the desired transformation from the aforementioned first set of signals to the aforementioned second set of signals.

In particular, the processes contemplated by the invention transform a first set of signals, including (a) signals representing a given linear network defined in terms of a set of node identification signals, (b) a set of weighted/directed edge signals each of which identify the weight, direction and the pair of nodes in said network interconnected via a given edge, and (c) signals representing arbitrarily specified start and target nodes in said network (all stored in a database provided to a computer), into a second set of signals indicating the shortest path in said network between said start and target nodes, by incrementally creating an array of node identification signals, as a function of the contents of the array itself as the array is being created, from the first set of signals, where each entry of the array includes:

(a) a first signal having a unique value for identifying a given node in said linear network;

(b) a second signal for indicating if the given node is a permanent node (as defined hereinabove);

(c) a third signal representing the calculated shortest weight to the given node, calculated by the computer as a function of the variable contents of array as the array is being constructed; and (d) a fourth signal, for indicating the identity of a previously visited node in the path between the start node and the given node, which may be utilized to determine the shortest path from the target node back to the start node at the completion of the array creation process whenever said the node is in the shortest path between the start and target nodes.

Figure 5:
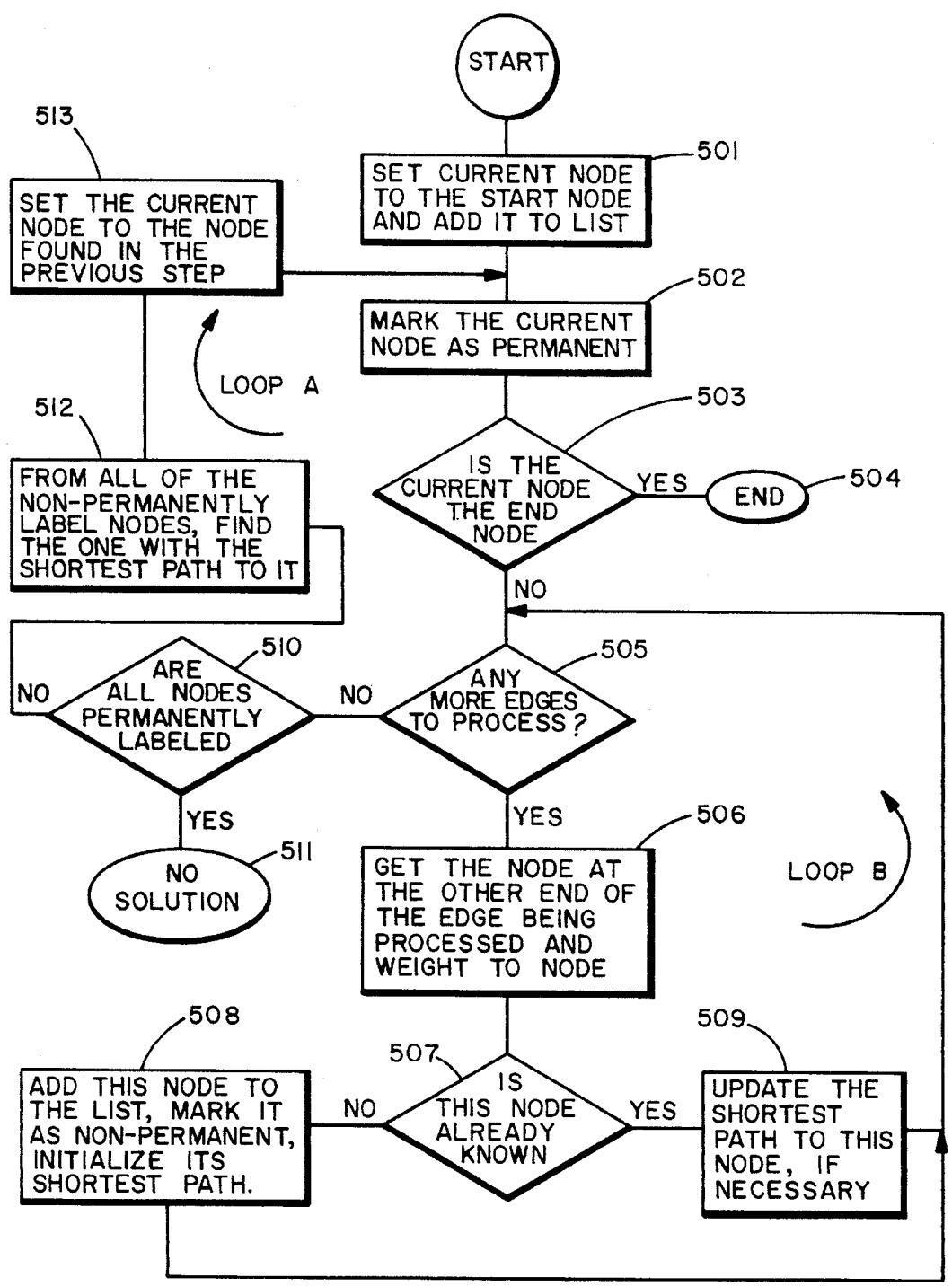
FIG. 5 depicts, in the form of a flowchart, an illustrative example of the type of process contemplated by the invention.

An example of the type of process contemplated by the invention, in the context of a specific example, may be seen with reference to the process depicted (in the form of a flowchart) in FIG. 5, and may be best understood with reference to the array created (over time), as depicted in FIGS. 6A–6E, by using such a process. In particular, the array entries depicted in the tables shown in FIGS. 6A–6E will be useful in demonstrating how the shortest path between a specified start node, and a specified target node, can be efficiently determined using the invention.

Before explaining the process set forth in FIG. 5 and the tables shown in FIGS. 6A–6E, it should be noted that preferred versions of the processes contemplated by the invention, although not explicitly reflected in FIG. 5, not only make use of the use of the "one step process" (to be explained in detail hereinafter); but also maintain array data (as the aforementioned signal transformation is taking place to create the desired array), in the form of binary trees and linked lists. This is recommended in order to optimize the signal processing task and thereby enhance the conservation of computing resources.

Those skilled in the art will readily appreciate that one of the problems with prior art shortest path determination methods, such as the one used in the referenced GPG GIS system, is that every time a node was encountered it had to be determined if the node was already "known" by the process. This search through the known nodes of the matrix can be very time consuming. By arranging (and maintaining) the "known" nodes from the given network in the form of a binary tree, the search and insertion times for "known" nodes can be significantly reduced.

Those skilled in the art will also readily appreciate that another one of the problems with prior art shortest path determination methods, such as the one used in the referenced GPG GIS system, is the determination of the next node to process. This portion of the known prior art processes needed to examine all known nodes, which have not been fully processed, and find the one with the shortest current path. This was typically implemented heretofore with a costly (particularly when the number of nodes is large) sequential search of all "known" nodes.

According to a preferred embodiment of the invention, only the nodes which have not been fully processed are arranged (and maintained) as part of a linked list. This significantly reduces the number of nodes which need to be examined; drastically reducing the time required to complete this portion of the processes contemplated by the invention.

With respect to the illustrative process depicted in FIG. 5 (and by way of comparison with the prior art), the prior art "two step" process referred to hereinbefore is, as previously indicated, reduced to a single process. That is, as the data for the network is being collected, the appropriate calculations are performed to determine the shortest path "so far". When the shortest path is found to the end node, the process stops. There is no need to look at any further data. This process is guaranteed to find the single shortest path. However, it does not have to visit every node on the network.

This approach, also as indicated hereinbefore, (1) reduces the number of data queries (of the given database that contains the first set of signals) to a minimum; (2) reduces the amount of storage needed by orders of magnitude (for large networks), because only a portion of the network is ever actually traced and needs to be stored (as will be demonstrated hereinafter with reference to FIG. 7A); and significantly reduces the time (and hence amount of processing resources) needed to solve the shortest path determination problem since it is no longer necessary to always visit every node in the network. The time savings will also be demonstrated hereinafter with reference to FIG. 7B.

Referring now to FIG. 5, the illustrative process depicted therein builds up an array of node identification signals, where each array entry includes: (a) a first signal having a unique value for identifying a given node in said linear network; (b) a second signal for indicating if the given node is a permanent node (as defined hereinabove); (c) a third signal representing the calculated shortest weight to the given node, calculated by the computer as a function of the variable contents of array as the array is being constructed; and (d) a fourth signal, for indicating the identity of a previously visited node in the path between the start node and the given node, which may be utilized to determine the shortest path from the target node back to the start node at the completion of the array creation process whenever the given node is in the shortest path between the start and target nodes.

The process depicted in FIG. 5 must first access the database; but only to obtain information concerning the designated start node (assumed to be node A in FIG. 3 for the sake of the illustrative example being set forth herein with reference to FIG. 3, FIG. 5 and FIGS. 6A–6E). For the sake of illustration and comparison with the prior art processes described hereinbefore with reference to FIG. 3 and FIGS. 4A–4B, node H in FIG. 3 will be designated as the target node.

According to block 501 in FIG. 5, a "current node" designator is set (initialized by the computer) to reflect that the designated start node is being processed; and an array entry for node A (the start node) is added to (and in this case is the first entry in) the array entry list of the array being incrementally created by the process.

When adding the array entry for the start node to array entry list, the aforementioned first signal (the unique node identification signal element for a given array entry, as shown in the column labeled "Node" in FIGS. 6A–6E), is set to the unique value identifying the start node; the aforementioned third signal (representing the calculated shortest weight to the node corresponding to a given array entry, as shown in the column labeled "Short" in FIGS. 6A–6E, normally calculated in the main loop of the process by the computer as a function of the variable contents of array as the array is being constructed), is set to zero; and the aforementioned fourth signal (for indicating the identity of a previously visited node in the path between the start node and the node corresponding to the entry being created, as shown in the column labeled "Path" in FIGS. 6A–6E), is set to a value indicating that this first array entry is in fact for the designated start node.

Entering the main loop of the process, as shown at block 502, the current node in the list of array entries (start node A at this time), is marked as being a permanent node. In other words, the aforementioned second signal in the array entry for the current node being processed (as shown in the column labeled "Perm" in FIGS. 6A–6E) is set to indicate that the node is permanent.

Block 503 of FIG. 5 then indicates that a test is made to determine if the current node is in fact the end (target) node. If the result of this test is positive, the process of accumulating the information necessary to determine the shortest path to the end node is complete.

Once this information has been obtained, the process path depicted in FIG. 5, exiting at 504, is taken. The computer may then be used to "backtrack" to the start node, by using the target node's "Path" signal (the aforementioned fourth signal in the array entry corresponding to a given node), to determine the previously visited node in the shortest path, in the same manner described hereinbefore (with respect to prior art processes) with reference to FIG. 4B. A specific example of how this shortest path determination may be made using the actual array created be the process being described with reference to FIG. 5, will be set forth at the completion of the description of the illustrative process with reference to FIG. 6E.

If the result of the test performed at block 503 is negative, i.e., the current node is not the target node, the illustrative process continues with the performance of the test shown at block 505, namely, determining if there any more outgoing edges to process with respect to the current node (so far none of the edges leaving start node A, edge 310 going from node A to node B and edge 311 going from node A to node D as shown in FIG. 3, have been processed).

If the test at block 505 indicates that there are outgoing edges to process, then each such edge is processed one at a time. However, if there are no more edges to process for the current node, then "Loop A" shown in FIG. 5, according to the illustrative embodiment of the invention, is taken. The processing that takes place in Loop A will be described hereinafter following the description of what happens if the current node does have more edges to process.

Assuming that the test at block 505 indicates that there are more outgoing edges to process for the current node, then the process obtains (for each edge sequentially) the identification of the node at the other end of the of the edge being processed (referred to hereinafter as the "other" node), along with the weight of the edge being processed. This information can be retrieved as needed directly from the database, and is indicated as being obtained at block 506 of the process depicted in FIG. 5.

After obtaining the information required with respect to a given edge at block 506, a test is performed, as indicated at block 507, to determine if the other node is "known" (i.e., to determine if an array entry exists for the other node in the list of array entries created so far).

If the other node is not already known, an array entry for the other node is added to the array entry list. When adding an array entry to the array entry list being incrementally created, the first signal ("Node") for the new array entry is set to identify the "other" node, the second signal ("Perm") for the new array entry is set to indicate that the other node is non-permanent, the third signal ("Short") for the new array entry is set to the calculated weight to the current node plus the weight of the edge being processed, and the fourth signal ("Path") is set to the value of the current node identification signal.

After performing the step indicated at block 508, the illustrative process loops back to block 503 as indicated by "Loop B" in FIG. 5, to once again determine if there are any more edges to process for the current node.

If the test performed at block 507 indicates that the other node is already known (i.e., an array entry does exist for the other node in the list of array entries created so far), then the shortest path to the other (already "known") node is updated, if necessary, as indicated at block 509 of FIG. 5.

The update function is required only if the weight indicated by the value of the third signal ("Short") for the other (the "known") node is greater than the sum of the weights in the array entry list for the current node and the weight of the edge being processed. In such instances, the third signal in the array entry corresponding to the other ("known") node is updated to reflect the weight corresponding to the lesser valued sum, and the fourth signal ("Path") for this same array entry is also updated to indicate that the previously visited node, yielding this shortest path so far (to the other "known node"), is the current node.

After performing any necessary update at block 509, Loop B is taken to once again determine if there are any more edges to process for the current node.

Finally, after all the edges for the current node have been processed, the path to the left of block 505 (Loop A) is taken, and a test is performed at block 510 to determine if all the nodes for which array entries exist (at the point in time when the test is being performed), are permanently labeled.

If all the nodes are permanently labeled and the end node has not yet been processed, then no path to the end node exists and the process can terminate as indicated at block 511 in FIG. 5.

However, if non-permanently nodes exist in the array created thus far, the non-permanently labeled node with the shortest path to it is found as indicated at block 512 of FIG. 5. This node can be found with reference to the aforementioned first and third signals in each array entry having its second signal indicating that the array entry is non-permanent.

The node found at block 512 is then designated as the new "current node" (as indicated at block 513 of FIG. 5); the process continues starting with reentry to the main loop at block 502.

When the illustrative process is finished (unless no path to the target node exists), i.e., the process terminates at block 504, the weight of the shortest path will be in the "Short" field of the array entry corresponding to the target node. The shortest path can be found, in reverse order, by using the backtracking process referred to hereinbefore, starting with the "Path" (fourth signal) entry for the target node, and continuing until the start node is found.

Using the improved techniques described hereinabove, it would be easy to solve the problem of determining the aforementioned hypothetical problem of finding the shortest route between Albany and New York City (with the given network consisting of over a million highway sections in the United States), since only a few hundred nodes would ever actually need to be examined.

Reference should now be made to FIGS. 6A–6E which indicate the contents of the array entry list being incrementally created by using the process described with reference to FIG. 5 (applied to the network depicted in FIG. 3, with node A as the start node and node H as the target node).

The table depicted in FIG. 6A shows the contents of the array entry list after processing node A utilizing the illustrative process described with reference to FIG. 5.

The table depicted in FIG. 6B shows the contents of the array entry list after processing node B utilizing the illustrative process described with reference to FIG. 5. The vertical bars, located to the left of the entries for nodes B and C in FIG. 6B, indicate that these entries were either modified (as was the case for node B) or were added (as was the case for node C), with respect to the previous table (in this case FIG. 6A), by the illustrative process described with reference to FIG. 5, as part of the overall process of incrementally creating the final array depicted in FIG. 6E.

Likewise, the tables depicted in FIGS. 6C–6D show the further incremental creation of the array ultimately shown in FIG. 6E, by the illustrative process depicted in FIG. 5. In particular, FIG. 6C shows the state of the array list after processing node D from FIG. 3; FIG. 6D shows the state of the array list after the processing of Node E from FIG. 3, and FIG. 6E shows the state of the array list after the processing node C from FIG. 3 (after which the shortest path to target node H can be determined).

With reference to FIG. 6E it can be seen that the shortest path between target node H and start node A, can be found in the "Path" fields of the array, by backtracking starting at node H. The Path entries lead from node H to node C, back to node E, and finally to node A via node D. The shortest path has a weight of 13 as may be seen with reference to the "Short" field of the array list entry for node H.

It should be noted that no matrix (or sparse matrix) needed to be created to perform the above described process; and that the final array list (as shown in FIG. 6E), has only 7 entries, compared with the 19 entries shown in FIG. 4B.

The savings in memory and processing time, utilizing the illustrative process described hereinabove, can be quantified for the purpose of comparing the prior art shortest path determination processes with the processes contemplated by the invention. Reference should be made to FIGS. 7A–7B which depict, in tabular form, a comparison of the time and storage requirements to solve the shortest path determination problem utilizing each of two forms of prior art processes; versus the type of process contemplated by the invention.

The prior art processes are characterized as those requiring a full matrix of network data to be created and stored (shown in the "full matrix" rows of FIG. 7A), and those that use (and store) a sparse matrix (shown in the "sparse matrix" rows of FIG. 7A). The amount of storage required by either of these prior art processes can be significant, as may be seen with reference to FIG. 7A, regardless of the complexity or simplicity of the path being traced. Tile storage required by the type of processes contemplated by the invention is shown in the rows labeled "improved". The drastic differences in the best and average cases can also be observed with reference to FIG. 7A.

The table depicted in FIG. 7B, as indicated hereinabove, compares the approximate processing times of the "existing" (prior art) shortest path determination processes, and the "improved" processes contemplated by the invention.

It should be noted, for the sake of completeness, that the prior art process entries in the tables depicted in FIGS. 7A–7B, were created utilizing the formula found in the previously incorporated reference, at page 603, using values of 1,000; 5,000; and 20,000 for n (the number of network nodes) and a value of 25 for m (the maximum number of edges emanating from a given node in the network).

Finally, again for the sake of completeness, reference should be made to FIGS. 8A–8B which depict, in the form of a commented C code listing, a particular implementation of the process contemplated by the invention, suitable for execution on a digital computer.

What has been described in detail hereinabove are methods and apparatus meeting all of the aforestated objectives. As previously indicated, those skilled in the art will recognize that the foregoing description has been presented for the sake of illustration and description only. It is not intended to be exhaustive or to limit the invention to the precise form disclosed, and obviously many modifications and variations are possible in light of the above teaching.

The embodiments and examples set forth herein were presented in order to best explain the principles of the instant invention and its practical application to thereby enable others skilled in the art to best utilize the instant invention in various embodiments and with various modifications as are suited to the particular use contemplated.

It is, therefore, to be understood that the claims appended hereto are intended to cover all such modifications and variations which fall within the true scope and spirit of the invention.

What is claimed is:

1. A method of operating a modeling system, with the aid of a digital computer, to transform a first set of signals, including (a) signals representing a given linear network defined in terms of a set of node identifications signals, (b) a set of weighted/directed edge signals each of which identify the weight, direction and the pair of nodes in said network interconnected via a given edge, and (c) signals representing arbitrarily specified start and target nodes in said network, into a second set of signals indicating the shortest path in said network between said start and target nodes, comprising the steps of:

(a) providing said computer with a database that includes at least said first set of signals, wherein said database is accessible by said computer to retrieve data during the transformation process; and (b) transforming with the aid of said computer said first set of signals into said second set of signals by incrementally creating an array of node identification signals through repeated direct reference to said first set of signals, all values of said first set of signals remaining constant during said incremental creation of said second set of signals.

2. A method as set forth in claim 1 wherein said step of transforming further comprises the step of determining the information to be retrieved from said database, to construct a given incremental portion of said array, as a function of the contents of the array itself as the array is being created.

3. A method as set forth in claim 2 wherein each entry in said array of node identification signals comprises:

(a) a first signal having a unique value for identifying a given node in said linear network;

(b) a second signal for indicating if said given node is a permanent node;

(c) a third signal representing the calculated shortest weight to said given node, calculated by said computer as a function of the variable contents of array as the array is being constructed; and (d) a fourth signal, for indicating the identity of a previously visited node in the path between the start node and the given node, which may be utilized to determine the shortest path from said target node back to said start node at the completion of the array creation process whenever said given node is in the shortest path between said start and target nodes.

4. A method as set forth in claim 3 wherein said step of transforming further comprises the step of maintaining the entries in said array as part of a binary tree.

5. A method as set forth in claim 4 wherein said step of transforming further comprises the step of sorting said binary tree based on the unique value of said first signal for a given node.

6. A method as set forth in claim 3 wherein the entries of said array which are not associated with permanent nodes, as indicated by said second signal for each array entry, are maintained in a linked list.

7. A method as set forth in claim 3 wherein said step of transforming, including the step of incrementally creating an array of node identification signals directly from said first set of signals, further comprises the steps of:
(a) initializing said array with a first array entry for said start node, wherein the step of initializing further includes the step of labeling said start node as a permanent node utilizing the second signal in said first array entry;
(b) adding a new entry to said array for each node that can be reached directly via an edge from the last node labeled permanent, so long as a corresponding array entry for the node that can be reached does not already exist; and
(c) updating the third and fourth signals in a given array entry existing prior to performing said step of adding, corresponding to a given node that can be reached directly via an edge from the last node labeled permanent, whenever it is determined by said computer that the calculated shortest weight to the given node is less than a previously calculated shortest weight to the given node.

8. A method as set forth in claim 7 wherein said step of adding a new array entry further comprises the steps of:
(a) determining the value of the first, third and fourth signals of each new array entry, with the aid of said computer, based on said set of weighted/directed edge signals provided to said computer via said database and based on the contents of the array entry associated with the last node labeled permanent; and
(b) setting the second signal of each new array entry to indicate that the corresponding node is not labeled permanent.

9. A method as set forth in claim 8 further comprising the steps of:
(a) determining if the nodes associated with all of the array entries are labeled as being permanent;
(b) defining said second set of signals to be the empty set whenever the nodes associated with all the array entries are labeled as being permanent; and
(c) terminating the array creation process whenever the nodes associated with all the array entries are labeled as being permanent.

10. A method as set forth in claim 9 further comprising the steps of:
(a) determining which array entry has the smallest calculated weight, from the set of remaining array entries corresponding to nodes which have not been labeled permanently;
(b) setting the second signal, of the array entry determined in step (a) to have the smallest calculated weight, to indicate that the node associated with the array entry is permanent;

(c) determining if the node associated with the array entry for which the second signal was set, in step (b), is the target node; and
(d) terminating the array creation process whenever the node associated with the array entry for which the second signal was set, in step (b), is the target node.

11. A method as set forth in claim 10 further comprising the step of repeating the aforestated process steps, beginning with said step of adding a new entry, so long as the array creating process is not terminated and at least one array entry exists for a node which have not been labeled permanent.

12. A method as set forth in claim 10 further comprising the steps of:
(a) utilizing said computer to determine the shortest path from said target node back to said start node, at the completion of the array creation process, based on the set of fourth signals in said array; and
(b) defining said second set of signals as the set of node identification signals which identify the nodes in the path determined in step (a), thereby completing the transformation of said first set of signals into said second set of signals.

13. A method as set forth in claim 10 wherein said step of determining which array entry has the smallest calculated weight is performed with the aid of said computer by comparing the values of the third signal for each of the array entries corresponding to the nodes which have not been labeled permanent.

14. A method as set forth in claim 7 wherein said step of initializing said array with a first array entry for said start node further comprises the step of setting the values of the first, third and fourth signals in said first array entry such that the first signal identifies the start node, said third signal indicates a calculated weight of zero, and said fourth signal indicates that the first array entry is the start node array entry.

15. A method as set forth in claim 1 wherein said modeling system is a geographical information system.

16. A method as set forth in claim 1 wherein said modeling system is a geographical positioning system.

17. A method as set forth in claim 1 wherein said modeling system is a computer aided design system.

18. A method as set forth in claim 1 wherein said modeling system is a computer aided manufacturing system.

19. A method of operating a computer assisted communications network to transform a first set of signals, including (a) signals representing a given linear communications network defined in terms of a set of node identification signals, (b) a set of weighted/directed edge signals each of which identify the weight, direction and the pair of nodes in said network interconnected via a given edge, and (c) signals representing arbitrarily specified start and target nodes in said network, into a second set of signals indicating the shortest path in said network between said start and target nodes, comprising the steps of:
(a) providing said computer with a database that includes at least said first set of signals, wherein said database is accessible by said computer to retrieve data during the transformation process; and
(b) transforming with the aid of said computer said first set of signals into said second set of signals by incrementally creating an array of node identification signals through repeated direct reference to said first set of signals, all values of said first set of signals remaining constant during said incremental creation of said second set of signals.

20. A method as set forth in claim 19 wherein said of transforming further comprises the step of determining the information to be retrieved from said database, to construct a given incremental portion of said array, as a function of the contents of the array itself as the array is being created.

21. A computer assisted process for transforming a first set of signals, including (a) signals representing a given linear communications network defined in terms of a set of node identification signals, (b) a set of weighted/directed edge signals each of which identify the weight, direction and the pair of nodes in said network interconnected via a given edge, and (c) signals representing arbitrarily specified start and target nodes in said network, into a second set of signals indicating the shortest path in said network between said start and target nodes, comprising the steps of:

(a) providing said computer with a database that includes at least said first set of signals, wherein said database is accessible by said computer to retrieve data during the transformation process; and (b) transforming with the aid of said computer said first set of signals into said second set of signals by incrementally creating an array of node identification signals through repeated direct reference to said first set of signals, all values of said first set of signals remaining constant during said incremental creation of said second set of signals.

22. A method as set forth in claim 21 wherein said step of incrementally creating further comprises the step of determining the information to be retrieved from said database, to construct a given incremental portion of said array, as a function of the contents of the array itself as the array is being created.

23. A method as set forth in claim 22 further comprising the step of utilizing said computer assisted process in a computer aided modeling system, including a predefined modeling coordinate system, to determine the shortest path between two nodes in a linear network defined in said modeling coordinate system.

24. A method as set forth in claim 22 further comprising the step of utilizing said computer assisted process in a computer aided communications network to determine the shortest path between two nodes in said network.

25. A method as set forth in claim 22 wherein each entry in said array of node identification signals comprises:

(a) a first signal having a unique value for identifying a given node in said linear network;

(b) a second signal for indicating if said given node is a permanent node;

(c) a third signal representing the calculated shortest weight to said given node, calculated by said computer as a function of the variable contents of array as the array is being constructed; and (d) a fourth signal, for indicating the identity of a previously visited node in the path between the start node and the given node, which may be utilized to determine the shortest path from said target node back to said start node at the completion of the array creation process whenever said given node is in the shortest path between said start and target nodes.

26. A method as set forth in claim 25 wherein said step of incrementally creating further comprises the step of maintaining the entries in said array as part of a binary tree.

27. A method as set forth in claim 26 wherein said step of incrementally creating further comprises the step of sorting said binary tree based on the unique value of said first signal for a given node.

28. A method as set forth in claim 25 wherein the entries of said array which are not associated with permanent nodes, as indicated by said second signal for each array entry, are maintained in a linked list.

29. A method as set forth in claim 25 wherein said step of incrementally creating an array of node identification signals directly from said first set of signals, further comprises the steps of:

(a) initializing said array with a first array entry for said start node, wherein the step of initializing further includes the step of labeling said start node as a permanent node utilizing the second signal in said first array entry;

(b) adding a now entry to said array fox each node that can be reached directly via an edge from the last node labeled permanent, so long as a corresponding array entry for the node that can be reached does not already exist; and (c) updating the third and fourth signals in a given array entry existing prior to performing said step of adding, corresponding to a given node that can be reached directly via an edge from the last node labeled permanent, whenever it is determined by said computer that the calculated shortest weight to the given node is less than a previously calculated shortest weight to the given node.

30. A method as set forth in claim 29 wherein said step of adding a new array entry further comprises the steps of:

(a) determining tile value of the first, third and fourth signals of each new array entry, with the aid of said computer, based on said set of weighted/directed edge signals provided to said computer via said database and based on the contents of the array entry associated with the last node labeled permanent; and (b) setting the second signal of each new array entry to indicate that the corresponding node is not labeled permanent.

31. A method as set forth in claim 30 further comprising the steps of:

(a) determining if the nodes associated with all of the array entries are labeled as being permanent;

(b) defining said second set of signals to be the empty set whenever the nodes associated with all the array entries are labeled as being permanent; and (c) terminating the array creation process whenever the nodes associated with all the array entries are labeled as being permanent.

32. A method as set forth in claim 31 further comprising the steps of:

(a) determining which array entry has the smallest calculated weight, from the set of remaining array entries corresponding to nodes which have not been labeled permanently;

(b) setting the second signal, of the array entry determined in step (a) to have the smallest calculated weight, to indicate that the node associated with the array entry is permanent;

(c) determining if the node associated with the array entry for which the second signal was set, in step (b), is the target node; and (d) terminating the array creation process whenever the node associated with the array entry for which the second signal was set, in step (b), is the target node.

33. A method as set forth in claim 32 further comprising the step of repeating the aforestated process steps, beginning with said step of adding a new entry, so long as the array creating process is not terminated and at least one array entry exists for a node which have not been labeled permanent.

34. A method as set forth in claim 32 further comprising the steps of:

(a) utilizing said computer to determine the shortest path from said target node back to said start node, at the completion of the array creation process, based on the set of fourth signals in said array; and (b) defining said second set of signals as the set of node identification signals which identify the nodes in the path determined in step (a), thereby completing the transformation of said first set of signals into said second set of signals.

* * * * *

UNITED STATES PATENT AND TRADEMARK OFFICE
CERTIFICATE OF CORRECTION

PATENT NO. : 5,561,790
DATED : October 1, 1996
INVENTOR(S) : William E. Fusaro

It is certified that error appears in the above-indentified patent and that said Letters Patent is hereby corrected as shown below:

Column 20, line 66, insert --step-- between "said" and "of"

Column 22, line 12, substitute --new-- for "now"

Column 22, line 12, substitute --for-- for "fox"

Column 22, line 27, substitute --the-- for "tile"

Signed and Sealed this

Eleventh Day of March, 1997

Attest:

BRUCE LEHMAN

*Attesting Officer*     *Commissioner of Patents and Trademarks*